United States Patent [19]

Class et al.

[11] Patent Number: 4,581,118
[45] Date of Patent: Apr. 8, 1986

[54] SHAPED FIELD MAGNETRON ELECTRODE

[75] Inventors: Walter H. Class, Yonkers, N.Y.; Steven D. Hurwitt, Park Ridge, N.J.; Lin I, Piermont, N.Y.

[73] Assignee: Materials Research Corporation, Orangeburg, N.Y.

[21] Appl. No.: 461,022

[22] Filed: Jan. 26, 1983

[51] Int. Cl.⁴ .................. C23C 14/50; C23C 14/36
[52] U.S. Cl. .................. 204/298; 118/673; 118/728; 156/345; 204/192 R; 313/156
[58] Field of Search .................. 204/192 R, 298; 313/154, 156; 427/38, 39, 47; 118/623, 728; 156/345

[56] References Cited

U.S. PATENT DOCUMENTS

| | | | |
|---|---|---|---|
| 2,146,025 | 2/1939 | Penning | 250/27.5 |
| 3,884,793 | 5/1975 | Penfold et al. | 204/298 |
| 4,041,353 | 8/1977 | Penfold et al. | 315/267 |
| 4,126,530 | 11/1978 | Thornton | 204/192 EC |
| 4,180,450 | 12/1979 | Morrison, Jr. | 204/298 |
| 4,194,962 | 3/1980 | Chambers et al. | 204/298 |
| 4,404,077 | 9/1983 | Fournier | 204/192 R |
| 4,422,896 | 12/1983 | Class et al. | 156/643 |
| 4,431,473 | 2/1984 | Okano et al. | 156/345 |

OTHER PUBLICATIONS

Yasuhiro Horiike et al., High Rate Reactive Ion Etching Using Magnetron Discharge, Toshiba Research and Development Center, paper presented at Advanced Plasma Technology Conference and Seminar, Honolulu, Hawaii, Jan. 26–28, 1982, 19 pages.

Primary Examiner—John F. Niebling
Assistant Examiner—William T. Leader
Attorney, Agent, or Firm—Kenyon & Kenyon

[57] ABSTRACT

A substrate support electrode for use in plasma processing equipment has a book-shaped prismatic body containing a magnet core with flange-like pole pieces at each end to provide a longitudinal magnetic field wrapped around the electrode body. An auxiliary field-shaping magnet spaced from a substrate support face of the electrode body, with each of its poles adjacent to the pole piece electrode body with each of its poles adjacent to the of like polarity of the electrode, flattens the magnetic field adjacent to the electrode support surface to produce a thin plasma of substantially uniform thickness close to the electrode surface.

16 Claims, 8 Drawing Figures

SHAPED FIELD MAGNETRON ELECTRODE

BACKGROUND OF THE INVENTION

The present invention relates to apparatus for magnetically enhanced bias sputtering and plasma etching.

Sputter coating is a well-known technique for coating a substrate with material eroded from the cathode of a low pressure gas electrical discharge (glow discharge) created between a cathode and an anode maintained at a suitable voltage difference in a low pressure gas atmosphere. A glow discharge contains an abundance of positively charged ions formed by collision of electrons with atoms of the low pressure gas. The resulting ions are attracted to the negatively charged cathode, which they impact with considerable energy. This ion impact dislodges cathode surface atoms which will then condense on, and thereby coat, the surface of any object placed near the cathode.

Since sputtering is a low pressure process, it must be carried out in a hermetically sealed chamber, which is first evacuated and then back-filled with a suitable sputtering gas, usually argon, and maintained at the proper sputtering pressure, typically 5 to 40 millitorr.

In many coating applications a substrate to be coated is placed on the anode of the gas discharge, since the anode is usually directly opposite the cathode, in a suitable location for coating by dislodged cathode atoms. Most sputtering systems use an anode at ground potential and apply a large negative voltage to the cathode; the grounded sputtering chamber then becomes an auxiliary anode.

Bias sputtering is a modified sputter coating technique in which a bias potential, usually negative, is applied to the substrate which is to be coated. This bias potential causes some of the gas discharge ions to be attracted to the substrate during the deposition process. The ion impact can produce desirable changes in the nature of the sputter coating. An important use of the bias sputtering technique is in the so-called reactive sputtering process. During reactive sputtering, a chemically active gas, such as oxygen or nitrogen, is added to or substituted for the usual inert sputtering gas (e.g., argon). Reactive species of such active gas are created in the glow discharge region, along with the usual argon ions, and these species react with sputtered target atoms deposited on the substrate to form a desired compound. The reactive sputtering technique thus permits sputtering from a pure metal target, aluminum for example, to produce a compound coating on the substrate (e.g., aluminum oxide or aluminum nitride). Reactive sputtering has economic advantages because the sputtering rate from a metal target is much higher than from a target composed of the metallic compound.

Bias sputtering, by placing a negative potential on the substrate, increases the chemical reaction rate by, among other things, attracting the positively charged reactive gas species or ions. Substrate biasing has a limitation, however, because ion bombardment can also cause undesirable substrate heating and gas ion implantation in the coating. Thus, the problem is to obtain a large flux of low-energy ions (energy levels of 20 to 100 electron-volts) which are sufficient for the chemical reaction process at the substrate surface, without getting a significant amount of high-energy ion bombardment.

The same need to generate a large flux of low-energy ions is found in other plasma processes, such as plasma etching. Plasma etching is becoming increasingly important because it is superior to wet chemical processes for etching microscopic features, when used in conjunction with a suitable etch mask, in the manufacture of silicon integrated circuits. Present day very large scale integrated circuits (VLSI circuits), such as are used for semiconductor memories and processors, require a manufacturing capability to etch patterns having micron and even sub-micron dimensions.

The typical pattern etching procedure involves first applying a film of a photosensitive, X-ray sensitive, or electron-beam sensitive polymer (called a photoresist, X-ray resist, or electron-beam resist, according to the type of sensitivity) on the surface of a previously deposited layer which is to be etched. This polymer film is then selectively exposed to sensitizing radiation through a selectively opaque pattern or by modulated beam scanning.

Subsequent development of the exposed portions of the resist causes either the exposed or the unexposed portions to be removed, depending on whether the polymer is a positive resist or a negative resist. In either case, the resulting etch mask permits selective etching away of the portions of the underlying layer from which the resist was removed during development. This layer is usually a metal or a dielectric which serves some electrical function in the integrated circuit.

When etching is completed, the remaining resist material is removed by a resist stripping process, leaving behind the unetched portions of the underlying layer in the desired pattern. An integrated circuit is produced by repeated sequences of layer deposition, resist application, exposure, development, etching, and resist stripping.

Basic to each of these plasma processes is the creation of an electrical gas discharge (plasma) by imposing a direct current (dc) voltage or, preferably, a radio frequency (rf) voltage between electrodes in a space occupied by a normally non-reactive gas at low pressure. Energetic electrons emitted from the negative electrode (i.e., the cathode) collide with neutral gas atoms or molecules to create ions or other reactive species and additional electrons, thereby initiating and maintaining a highly conductive glow discharge in a region adjacent to the electrode. This glow discharge or plasma is separated from the electrode surface by a dark space or plasma sheath.

Since the plasma is essentially equipotential, the voltage drop between the plasma and the electrode occurs in the plasma sheath, and the direction of the electric field is normal to the electrode surface. Consequently, the ions and other reactive species generated in the plasma, which typically carry a positive charge, are attracted to the electrode surface and travel from the plasma to the surface primarily in a direction parallel to the electric field lines. In the plasma processes considered here, the electrode serves as a substrate support, so when the ions or reactive species reach the surface of the substrate they either activate or take part in chemical reactions resulting in the respective resist development, layer etching, and resist stripping.

The kinetic energy required for the chemical reactions involved in plasma processing are much lower, however, than the energies typically encountered in diode sputtering (several electron volts as compared with several hundred ev). The excess ion energy available in a sputtering system, therefore, would merely generate heat if used for plasma etching. This is highly undesirable because the polymeric materials used for etch masks cannot generally be used at temperatures above about 250° C.

It is well known to increase plasma density in cathode sputtering processes by the use of a magnetic field. This causes a spiraling electron path and thus increases the probability of an ionizing collision with a gas molecule or atom. Particularly effective for increasing the ionization efficiency of plasmas are electron-trapping magnetic fields in which the lines of magnetic force cooperate with the electrode surfaces to form a completely enclosed region, preferably in which the magnetic field is orthogonal to the electric field.

It has been proposed to use magnetic enhancement also in lower energy plasma processes such as the bias sputtering and plasma etching processes described above. In one proposed arrangement, an electrode is formed with a prismatic body having several flat faces, constituting substrate support surfaces, arranged symmetrically about an axis. First and second magnetic pole pieces of opposite polarity project outwardly from the faces and extend completely around the electrode body at respective ends of the body, the resulting structure being basically spool-shaped. A magnetic field extending between the pole pieces thus forms a continuous belt around the body of the electrode adjacent to the substrate support surfaces.

The symmetrical prismatic spool shape of this previously proposed electrode provides multiple substrate support surfaces and is particularly suited to be mounted for rotation about its axis so that, in bias sputtering applications, each face can be directed in succession toward one or more sputtering targets. The prismatic shape also permits loading or processing a large number of substrates for a given size of electrode.

The symmetrical prismatic electrode must be centrally positioned in a vacuum chamber, however, and requires substrate holding devices because no more than one of the substrate support surfaces can be horizontal facing upwards. Many commercial sputtering systems, and particularly those used for integrated circuit production on ceramic wafers, are arranged to process the wafer substrates lying flat. A symmetrical prismatic electrode is not adapted for installation in such equipment.

In addition, the plasma region produced by such prismatic spool-shaped electrodes tends to be nonuniform, since the belt-like magnetic field bulges outward at its center region. This causes the plasma thickness to be greater at the center region than at the ends of the electrode body, thereby resulting in a nonuniform processing of the substrate surfaces.

SUMMARY OF THE INVENTION

A principal object of the present invention is to provide a magnetron substrate support electrode adapted for use in chambers in which the substrate lies flat.

Another object of the present invention is to provide a magnetron electrode structure that produces uniform plasma processing of the exposed surface of a substrate supported by the electrode.

These and other objects are achieved by a magnetron electrode that includes a rectangularly parallelepipedal body, the thickness of which is substantially less than its width and length, and two magnetic members constituting a first magnetic pole of one polarity disposed at one end of the body and a second magnetic pole of opposite polarity at the other end of the body.

One face of the electrode body is a substrate support surface, and each magnetic pole member projects beyond this face for the full width of the electrode body, so that a magnetic field extends longitudinally between the first and second poles for the full width of the electrode body adjacent to the substrate support surface. Preferably, the magnetic pole members project from both faces and the side edges of the body to form a continuous, peripheral flange at each end such that the magnetic field between the first pole and second pole surrounds the electrode body like a belt.

To improve uniformity of processing of the surfaces of a substrate placed on the electrode, an auxiliary magnet means can be positioned in spaced relation to and facing the electrode support surface, the auxiliary magnet means having a third pole member positioned adjacent to the first pole member of the electrode and having the same polarity. A fourth pole member of the auxiliary magnet is positioned adjacent to the second pole member of the electrode. The strength and location of the auxiliary magnet are such that the resultant field adjacent to the substrate support surface is flattened and extends substantially parallel to the support surface.

The above and other objects and features of the invention, as well as its advantages over the prior art will be more apparent from the following detailed description in connection with the accompanying drawings.

DETAILED DESCRIPTION OF THE PREFERRED EMBODIMENTS

Figure 1:
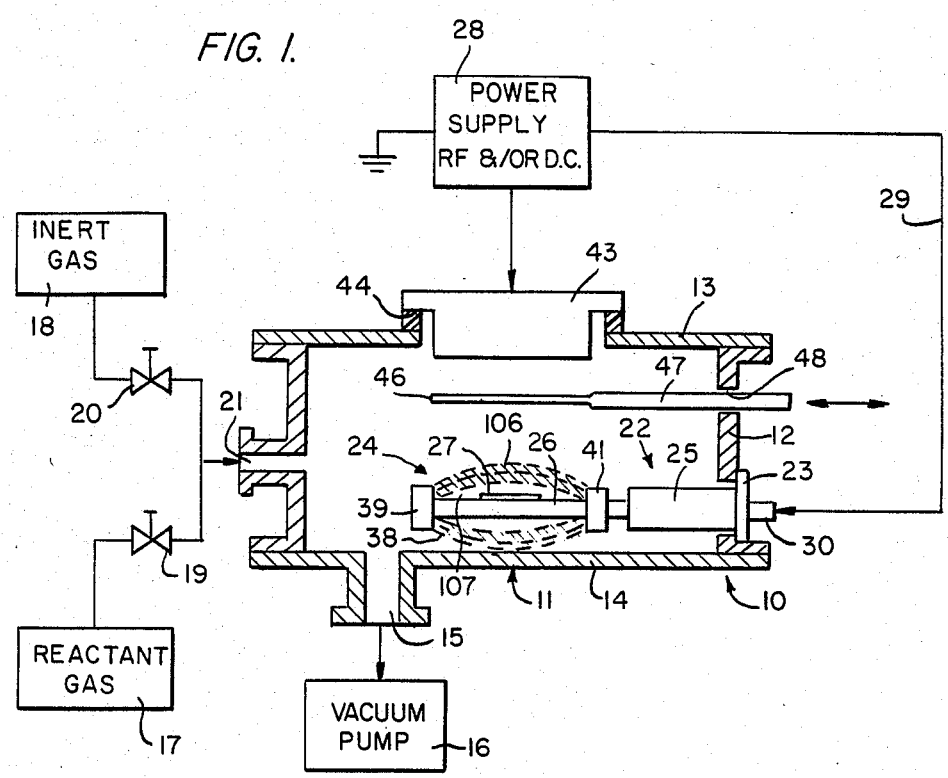
FIG. 1 is a semi-schematic view of a plasma processing apparatus including a magnetron electrode according to the present invention.

FIG. 1 illustrates in semi-schematic form a plasma processing apparatus 10 incorporating a substrate support electrode according to the present invention. The apparatus includes a hermetic chamber 11 having an open-ended shell 12 closed by a top sealing plate 13 and a bottom sealing plate 14. Not shown are conventional clamping means, such as bolts and nuts, and conventional seals, such as O-ring seals, which are needed to provide the necessary vacuum-tightness of the chamber assembly.

A pump-out opening 15 in the bottom plate leads to a vacuum pump 16, and at least one reactant gas, such as oxygen, may be introduced into the chamber, either alone or with an inert gas, such as argon, from respective sources 17 and 18 through respective valves 19 and 20 and inlet 21.

A magnetron substrate support electrode assembly 22 extends into the chamber and is sealingly attached to the shell 12 by a mounting plate 23 and suitable fasteners and seals (not shown).

The substrate support electrode assembly 22 includes an electrode 24 of rectangular cross section carried by a tubular support 25 which is welded or otherwise attached to mounting plate 23.

The upper face 26 of the electrode serves as a support surface for a substrate 27, such as a conventional ceramic disc or semiconductor wafer used in the manufacture of integrated circuits. RF power is supplied from a power supply 28 via line 29 to a coupling 30 mounted on the outer end of the electrode assembly 22. The rf power supply can be of any commercially available type used in conventional plasma processing systems. Coupling 30 also may be equipped with inlet and outlet connections (not shown) for permitting a flow of cooling water to the interior of the substrate support electrode.

Figure 2:
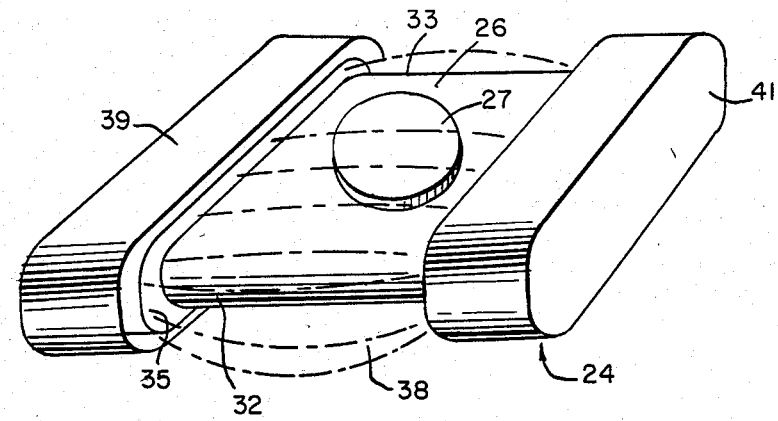
FIG. 2 is a perspective view of the magnetron electrode shown in FIG. 1.
Figure 3:
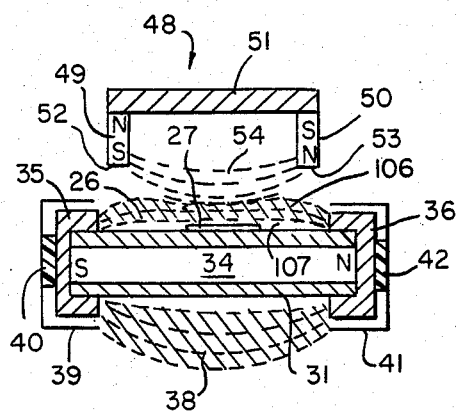
FIG. 3 is a simplified elevation view in cross section of the magnetron electrode of FIG. 1 with an auxiliary field-shaping magnet means.

With reference to FIGS. 2 and 3, the substrate support electrode 24 is an assembly comprising an electrode body 31 of electrically conductive nonmagnetic material, such as copper or aluminum. Body 31 is generally in the form of a rectangular parallelepiped having a thickness dimension that is substantially less than its length or width dimensions. In other words, it is "book-shaped", preferably with rounded side edges 32 and 33 (see FIG. 2).

Disposed within body 31 is at least one bar magnet 34 extending longitudinally between a first magnetic member 35 constituting a first magnetic pole and a second magnetic member 36 constituting a second magnetic pole. The magnetic members are composed of magnetically permeable material such as soft iron. Each magnetic member is disposed at a respective end of the electrode body and projects outwardly from at least the support face 26 of the electrode body for the full width of the body. Preferably, the magnetic members 35 and 36 also project from the obverse face 37 and the side edges 32 and 33 to form continuous peripheral flanges at each end of the electrode body. As a result a magnetic field, indicated by broken lines 38, extends longitudinally across the air gap between the first and second magnetic poles and completely surrounds the electrode body like a belt or curtain. Thus, the magnetic field in combination with the electrode structure forms an enclosed electron trap adjacent to the exposed surfaces of the electrode body. The strength of this magnetic field is preferably in the range of approximately 50 to approximately 1000 gauss.

When rf power is applied to the electrode, a dense glow discharge or plasma is created in this electron trap. To prevent this discharge from extending to the adjacent surfaces of the electrode assembly, a cup-shaped dark space shield 39 is attached to an insulator 40 which in turn is fastened to the magnetic pole piece 35. A corresponding dark-space shield 41 is attached via an insulator 42 to the pole piece 36 mounted on the other end of the electrode body. In addition, to prevent contamination of the substrates 27, annular pole piece lids (not shown) can be fastened to the exposed surfaces of pole pieces 35 and 36, the material of the lids being inert to the reactive species in the glow discharge.

Referring again to FIG. 1, the illustrated plasma processing equipment is capable of performing both bias sputtering and plasma etching. For the bias sputtering mode, a conventional target cathode assembly 43 is provided, the assembly being mounted by means of an electrical insulator ring 44 to the top of the chamber and being connected to the power supply via a line 45. In addition, a shutter 46 is mounted on a rod 47 that slidably extends through a vacuum-sealed opening 108 in the shell of the chamber.

The operation of the magnetron substrate support electrode will now be explained for both the bias sputtering and plasma etching modes. In the bias sputtering mode, after a substrate 27 to be sputter-coated has been placed on the support surface 26 of electrode 24, the vacuum pump 16 is turned on to evacuate the sputtering chamber 11. When a desired vacuum level has been maintained for long enough to sufficiently outgas the components in the chamber, an inert gas, a reactant gas, or a mixture of inert gas and reactant gas, depending on the type of coating to be applied, is introduced into the chamber through valves 19 and 20 until the desired operating pressure is reached; this is typically in the range of 0.1 to 50 millitorr. Sputtering power is next applied to the sputtering target 43, while the shutter 46 is in position in front of the sputtering source. This allows the material sputtered from the source to be deposited initially on the shutter, until the sputtering target surface is clean and ready to deposit uncontaminated material onto the substrate. At an appropriate time, rf power is applied to the substrate support electrode 24 to similarly sputter-clean the substrate.

The procedure described up to this point is conventional and well understood in the art (see, for example, the discussions in Part II-1 of "Thin Film Processes", edited by J. L. Vossen and W. Kern, Academic Press, Inc., 1978, and in Chapter 7 of "Gas Discharge Processes" by B. M. Chapman, J. Wiley & Sons, 1980).

When the sputter-cleaning procedure is complete, the shutter is moved aside to permit the sputtered material to be deposited on the substrate 27. After the desired coating thickness has been reached, the shutter is returned in front of the target, and the power is turned off.

The procedure for conducting plasma etching is basically the same as described above, except that the target cathode and the shutter are not present.

In either process, the application of rf power to the magnetron substrate support electrode 24 results in the formation of a dense gas discharge or plasma localized in the region of the magnetic belt which extends around the periphery of the electrode and is shown in cross-section in FIG. 1 by the dashed magnetic lines, 38. The glow discharge itself occurs within the region 106 contained within the diagonal lines. A similar confined discharge forms if a negative dc potential is applied to the electrode. Magnetic pole pieces 35 and 36 are exposed to the plasma in the regions near the magnetic gap. For this reason, they should be covered by pole piece lids (not shown) made of a material which is inert to the reactive species present in the plasma, if a reactant gas is being used in the coating or etching process.

It should be noted that the plasma region 106 extends towards, but does not reach and touch, those surfaces which are maintained at electrode potential. The space 107 where no plasma exists is known as the plasma sheath region. It is well known that when an electrode is capacitively coupled to an rf power supply, the rectification properties of the plasma cause a dc bias to develop between the electrode surface and the plasma. (see for example Chapter 5 of "Gas Discharge Process" by B. N. Chapman). The bias is such that the plasma is positive with respect to the electrode, except for a very short time period during each rf cycle. This dc bias creates an electric field in the plasma sheath region which is everywhere perpendicular to the electrode surface. The plasma itself is substantially free of electric fields.

The mechanism of ion formation in the plasma (and reactive radical formation when a reactant gas is used) starts with the emission of electrons from the negatively biased electrode surface. These so-called primary electrons are accelerated towards the plasma by the electric field in the plasma sheath 107, gaining sufficient energy to cause ionization and reactive species formation upon collision with neutral gas atoms. In the absence of the magnetic field, a large fraction of the primary electrons continues to move away from the electrode surface, thereby extending the glow discharge to regions which are far removed from the electrode surface. In addition, many do not collide with a gas atom before they reach an anode surface, so that the degree of ionization and reactive species generation is limited.

The enclosed magnetic field of FIG. 1 alters the electron trajectories, dramatically improving this situation. Consider, for example, those electrons which are emitted from the electrode face 26 and from the exposed surface of the substrate 27. Here the sheath electric field is perpendicular to the magnetic field. As a result, the E×B electron drift motion is directed out of the plane of FIG. 1, causing the electrons to circulate around the periphery of the prismatic electrode, remaining at all times in the magnetic belt, very close to substrate 27, whereby ionization or reactive species generation induced by these electrons is confined to a plasma region close to the electrode surface.

The electrons emitted from the projecting pole piece surfaces are confined in a different way. Here, the sheath electric field lines are parallel to the magnetic field lines, so the electrons, after acceleration into the plasma region, continue to move in a spiralling manner parallel to the magnetic field lines. This motion carries the electrons to the opposite surface. However, upon approaching the opposite sheath field, the electrons are repelled back into the plasma and are consequently also trapped, oscillating to and fro close to the substrate surface.

Thus, all the electrons are trapped by the combined action of the closed loop E×B drift and the oscillating to and fro motion. Electrons can escape from this trap only slowly when collisions with gas atoms cause them to cross magnetic field lines until they finally move to the dark space shields 39 and 41, whereupon they are removed from the discharge.

The radial spacing between the electrode substrate support face 26 and the plane defined by shields 39 and 41 largely determines the thickness of the plasma belt 106. Although this belt is maintained closely adjacent to the exposed substrate surface, it can be seen that the magnetic field lines curve or bulge convexly outward in the central region between the poles. Since the inner and outer envelopes of the glow discharge region conform generally to the magnetic field lines, it is clearly apparent from FIG. 1 that both the plasma and the sheath field are substantially thicker in the mid region than near the poles.

It has been found that the nonuniform thickness of the plasma belt and sheath field creates nonuniform results over the surface of the substrate. This is due to the fact that the positive ion trajectories are determined predominantly by the plasma sheath electric field; their mass is so much greater than that of the electrons that the positive ions are virtually unaffected by the magnetic fields used in this device (typically 50 to 1000 Gauss). The sheath field here causes some of the positive ions to be accelerated toward the electrode surfaces and, more importantly, toward the substrate surface, thereby causing some unwanted sputtering from the electrode and back sputtering from the substrate. The thicker the sheath field, the longer is the path over which the ions will be accelerated. Thus, they arrive at the substrate with the greatest energy where the sheath field is the thickest.

An important aspect of the present invention is the use of an auxiliary magnet means to shape the magnetic field to be flatter and more concentrated closely adjacent to the electrode surface. With reference to FIG. 3, this field shaping is accomplished by an auxiliary magnet 48 spaced from and facing the substrate support surface of the electrode 24. The auxiliary magnet 48 includes two bar magnets 49 and 50 positioned adjacent to the first and second magnetic pole members 35 and 36, respectively, of the electrode assembly. Each magnet 49 and 50 extends parallel to and for the full width dimension of the electrode body (i.e. perpendicularly to the plane of the drawing), and each is magnetized so that one side edge is an N pole and the opposite side edge is an S pole.

The two magnets 49 and 50 are oriented in bucking relation to the first and second poles of the electrode, that is, like poles facing each other, and a magnetic circuit is completed between the other poles of these magnets by a bar or plate 51 of soft iron or other magnetically permeable material. Thus, the three-piece assembly constitutes a magnet that is U-shaped in cross section and presents a third pole 52, close to and of the same polarity as the first pole 35 of the electrode, and a fourth pole 53, close to and of the same polarity as the second pole 36 of the electrode.

As can be seen from FIG. 3, the auxiliary magnet 48 produces magnetic lines of force 54 spanning the air gap between its poles and bulging outward in opposition to the magnetic field lines 38 of the electrode. As a result, the bulge of the magnetic field 38 is flattened and the field is concentrated close to the electrode surface 26. Consequently, the thickness of the plasma region 106 and the thickness of the plasma sheath 107 are both reduced and made more uniform.

Figure 4:
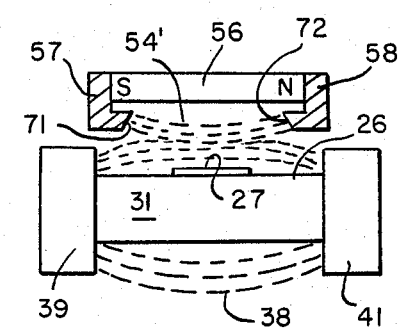
FIG. 4 is a simplified elevation view of the magnetron electrode of FIG. 1 with an alternative auxiliary field-shaping magnet means.

FIG. 4 shows an alternative arrangement of an auxiliary magnet, with other components of the electrode structure being identical to those shown in FIG. 3 and identified by the same reference numerals. The auxiliary magnet 55 reverses the location of the magnet and the permeable material. Thus, one or more bar magnets 56 extend longitudinally between permeable pole pieces 57 and 58. The magnetic result is basically the same, however, with pole piece 57 forming an S pole adjacent to the S pole of the electrode, and pole piece 58 forming an N pole adjacent to the N pole of the electrode. As before, the bulge of the magnetic field lines 38 is flattened, and the lines are concentrated closer to the electrode surface.

Figure 5:
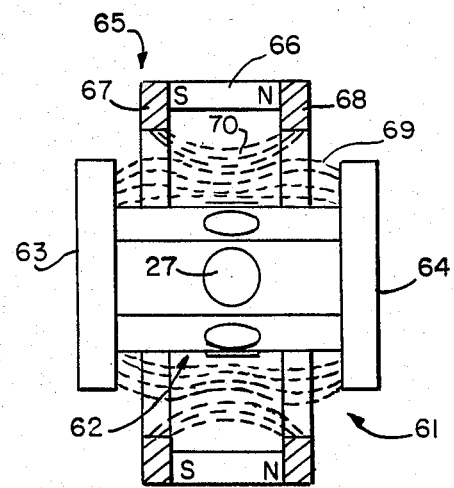
FIG. 5 is a simplified elevation view in partial cross section of a symmetrically prismatic magnetron electrode with an annular auxiliary field-shaping magnet means.

The field-shaping magnet of the invention can also be adapted for use with the previously proposed prismatic electrode discussed earlier. With reference to FIG. 5, a magnetron electrode 61 has an octagonally prismatic body 62 with flanged magnetic pole pieces (not shown) at each end covered by dark space shields 63 and 64. The body of the electrode is coaxially surrounded by an annular auxiliary magnet 65. The auxiliary magnet comprises a cylindrical ring magnet 66 with flat annular pole pieces 67 and 68 of magnetically permeable material. The inner circumferential edges of the pole piece rings therefore become the poles of the auxiliary magnet and are disposed in bucking relation to the magnetic poles of the electrode. As a result, the magnetic field lines 69 of the electrode are flattened and concentrated by the magnetic field lines 70 of the auxiliary magnet.

It will be apparent that the field-shaping effect of the auxiliary magnet depends on its field strength and on the location of its poles relative to the poles of the electrode. The poles of the auxiliary magnet may be spaced closer together than the spacing of the poles of the electrode magnet structure, they can be spaced the same as the electrode magnet poles, or they can be spaced further apart. The pole ends of the auxiliary magnet structure can themselves be shaped to affect the field shaping. For example, the ends 71 and 72 of pole pieces 57 and 58 of the auxiliary magnet structure in FIG. 4 are inclined at an angle toward the substrate support surface of the electrode.

Figure 6:
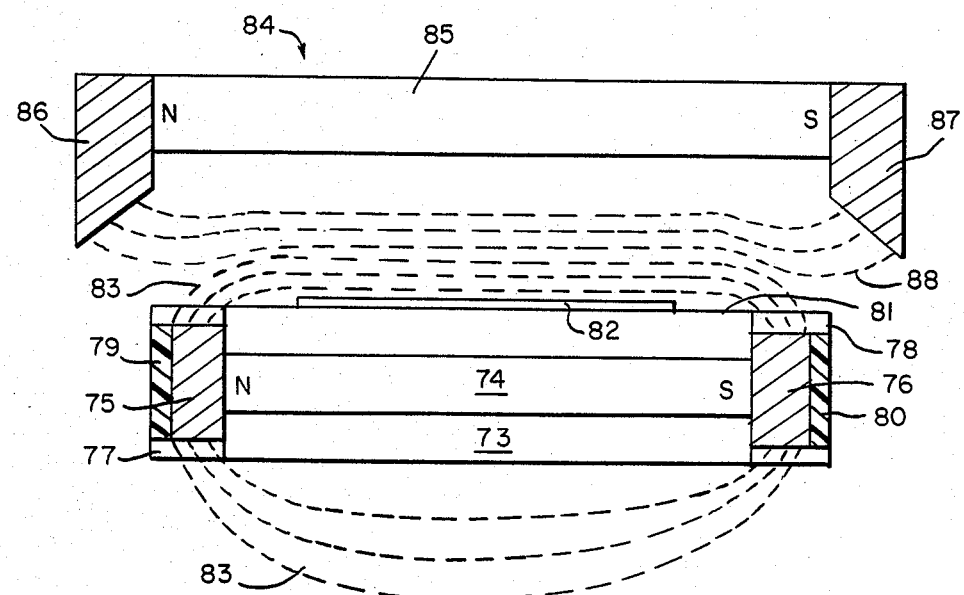
FIG. 6 is a simplified elevation view in cross section of an alternative embodiment of a magnetron electrode with an auxiliary field magnet means.

In addition, the electrode magnet structure can have pole pieces which do not extend beyond the faces or side edges of the electrode body. As shown in FIG. 6, a substrate support electrode body 73 is provided with at least one internal bar magnet 74, as in the above-described embodiment of FIG. 3. Pole pieces 75 and 76 are disposed at respective ends of the electrode body and carry corresponding dark space shields 77 and 78 mounted on insulating spacers 79 and 80, respectively.

In the embodiment of FIG. 6, the pole pieces do not extend above the substrate support surface 81 of the electrode body but, instead, are recessed so that the top surfaces of the dark space shields can be substantially flush with the substrate support surface. This flush surface arrangement simplifies the design of automatic loading and unloading equipment for a substrate 82 to be placed on the support surface. Although the pole pieces are shown recessed from the lower face of the electrode body as well as from the upper face, this is not essential. Thus, a magnetron electrode could have a flush top surface and a flange-like extension of the pole pieces from the side edges and obverse face of the electrode body, if desired.

As in the previously described magnetron electrode embodiments, the pole pieces produce a magnetic field 83 that surrounds the exposed surfaces of the electrode body, thereby creating a closed electron-trapping field adjacent to the surfaces of the body between the poles. An auxiliary field shaping magnet 84 is positioned above the substrate support surface 81 and comprises a bar magnet 85 having pole pieces 86 and 87 attached one at each end. The magnetic field 88 produced by the auxiliary magnet flattens and concentrates the field above substrate 82, thereby increasing the uniformity of the resulting plasma generated during operation of the electrode.

Figure 7:
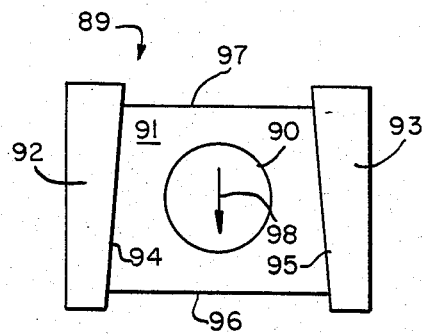
FIG. 7 is a plan view of an alternative embodiment of a magnetron electrode.
Figure 8:
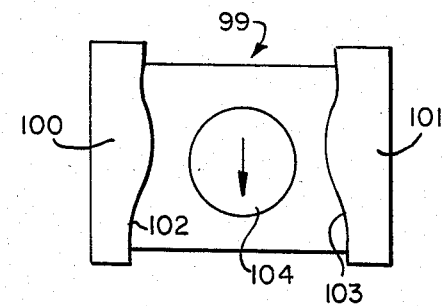
FIG. 8 is a plan view of another alternative embodiment of a magnetron electrode.

In addition to the use of auxiliary magnets, the field over the substrate support surface of the flat magnetron electrode of the present invention can be advantageously shaped by varying the spacing of the pole pieces of the electrode over the width dimension of its substrate support surface FIGS. 7 and 8 show two examples of such variation in spacing. In FIG. 7, a flat book-shaped magnetron electrode 89 supports a substrate 90 on its upper face 91. Pole pieces 92 and 93 at opposite ends of the electrode have nonparallel faces 94 and 95, respectively, so that the field increases in intensity from side edge 96 to side edge 97.

The purpose of the nonparallel pole pieces of FIG. 7 is to compensate for nonuniform plasma thickness over the substrate due to the effect of electron drift. With the magnetic poles arranged so that electron drift occurs in the direction of arrow 98 around the body of the electrode, centrifugal force as the electrons drift around edge 97 from the obverse side of the electrode causes the plasma to be thicker above edge 97 than above edge 96. By having closer spacing between the pole pieces adjacent to edge 97, the intensified field counteracts the outward drift of the electrons.

Instead of straight nonparallel surfaces 94 and 95 of FIG. 7, the magnetron electrode 99 of FIG. 8 has pole pieces 100 and 101 with curved edges 102 and 103, respectively, which may be provided to produce a desired field shape and intensity to achieve a uniform plasma thickness over the total area of a substrate 104.

Although the magnetron electrode and auxiliary magnets of FIGS. 3 through 6 are shown without supporting structure, it will readily be apparent to one of ordinary skill in the art how to mount these components in proper relation to each other, both physically and electrically, within or external to a vacuum chamber of a plasma processing system such as that shown in FIG. 1. It will be further apparent that modifications can be made and equivalent elements substituted for the particular embodiments described herein without departing from the spirit and scope of the invention.

We claim:

1. A plasma processing equipment including an evacuable chamber;
    means for evacuating the chamber;
    means for introducing a preselected reactant gas into the chamber;
    a cathode mounted in an upper part of the chamber and having a downward-facing sputtering surface;
    an electrode disposed beneath the cathode for supporting a substrate, the electrode comprising:
        a body having substantially the shape of a rectangular parallelepiped with mutually orthogonal length, width, and thickness dimensions, the thickness of the body being substantially less than the length and width of the body, the length and width dimensions defining a horizontal upward-facing substrate support face and an obverse face, the length and thickness dimensions defining opposite side edges, and the width and thickness dimensions defining opposite ends of the body, and
        two magnetic members, each disposed at a respective end of the electrode body, one of the magnetic members constituting a first magnetic pole of one polarity and the other magnetic member constituting a second magnetic pole of opposite polarity, so that a magnetic field extends between the magnetic members adjacent to the faces and side edges in a continuous belt surrounding the body; and a power supply connected to the sputtering cathode and the substrate support electrode for delivering electrical energy to the sputtering cathode at a first predetermined voltage appropriate for causing sputtering from said sputtering surface and for delivering electrical energy to the substrate support electrode at a second predetermined voltage appropriate for causing ionization of the reactant gas adjacent to the substrate support surface without causing significant sputtering from a substrate on said support surface.

2. The plasma processing equipment of claim 1, wherein each magnetic member projects beyond the faces and the opposite side edges of the body of the electrode to form a continuous peripheral flange at the respective end of the body.

3. The plasma processing equipment of claim 1 or 2 wherein the side edges of the body are convexly rounded in cross section.

4. The plasma processing equipment of claim 1, wherein the magnetic members comprise pole pieces of magnetically permeable material, and the substrate support electrode further comprises at least one magnet disposed within the body and extending longitudinally between the pole pieces.

5. The plasma processing equipment of claim 1, further comprising:
 a dark space shield of electrically conductive material surrounding each magnetic member and
 means for mounting each dark space shield in electrically insulated spaced relation to the respective magnetic member.

6. In a lower pressure chamber of a plasma processing device, a magnetron electrode apparatus for use as a substrate support electrode, the magnetron electrode apparatus comprising:
 an electrode body having a flat horizontal upward-facing retangular processing surface, with a length defined between first and second ends of the body and a width defined between two side edges of the surface;
 magnet means including first and second magnetic members disposed at the first and second ends of the electrode body, respectively, the first magnetic member constituting a first magnetic pole of one polarity and the second magnetic member constituting a second magnetic pole of opposite polarity, so that a magnetic field extends between the first and second magnetic poles continuously around the body; and
 additional magnet means having third and fourth magnetic poles disposed in spaced relation above the first and second magnetic poles, respectively, and facing the processing surface, said third magnetic pole having the same polarity as the first magnetic pole and said fourth magnetic pole having the same polarity as the second magnetic pole.

7. The magnetron electrode apparatus of claim 6, wherein said third and fourth magnetic poles each comprises a magnet having a pole facing the processing surface of the electrode body and a member of magnetically permeable material connecting the other poles of each of the magnets comprising said third and fourth poles.

8. The magnetron electrode apparatus of claim 6, wherein said third and fourth magnetic poles comprise pole pieces of magnetically permeable material, each pole piece having a surface facing the processing surface of the electrode body, and the additional magnet means further comprises a magnet extending longitudinally between said pole pieces.

9. The magnetron electrode apparatus of claim 8, wherein said surface of each pole piece facing the processing surface is inclined at an angle with respect to said processing surface.

10. The magnetron electrode apparatus of claim 6, wherein said electrode body has substantially the shape of a rectangular parallelepiped with mutually orthogonal length, width, and thickness dimensions, the thickness of the body being substantially less than the length and width of the body.

11. The magnetron electrode apparatus of claim 10, wherein the first and second magnetic members disposed at the first and second ends of the electrode body are non-parallel.

12. The magnetron electrode apparatus of claim 10, wherein each magnetic member extends beyond the width and thickness dimensions of the body to form a continuous peripheral flange at the respective end of the body, so that the magnetic field extending between said magnetic members completely surrounds the electrode body.

13. The magnetron electrode apparatus of claim 6, wherein said electrode body has a prismatic shape with a regularly polygonal cross section, said processing surface comprising one of the faces of the prismatic body, and said third and fourth poles of said additional magnet means comprises annular poles positioned coaxially with respect to said prismatic electrode body.

14. The magnetron electrode apparatus of claim 13, wherein each face of said prismatic electrode body comprises a plasma processing surface.

15. The magnetron electrode apparatus of claim 14, wherein the additional magnet means comprises a magnet in the form of a cylindrical shell, and two flat annular pole pieces abutting the respective ends of the magnet and constituting said third and fourth poles.

16. The magnetron electrode apparatus of claim 15, wherein the inner diameter of each flat annular pole piece is less than the inner diameter of the cylindrical magnet.

* * * * *